(12) United States Patent
Imai et al.

(10) Patent No.: US 8,923,748 B2
(45) Date of Patent: Dec. 30, 2014

(54) HIGH FREQUENCY MODULE AND RECEIVER

(75) Inventors: Tadashi Imai, Chiba (JP); Takayuki Kaida, Tokyo (JP); Hitoshi Masumura, Kanagawa (JP)

(73) Assignee: Sony Corporation, Tokyo (JP)

( * ) Notice: Subject to any disclaimer, the term of this patent is extended or adjusted under 35 U.S.C. 154(b) by 139 days.

(21) Appl. No.: 13/501,425

(22) PCT Filed: Oct. 4, 2010

(86) PCT No.: PCT/JP2010/067353
§ 371 (c)(1),
(2), (4) Date: Apr. 11, 2012

(87) PCT Pub. No.: WO2011/048934
PCT Pub. Date: Apr. 28, 2011

(65) Prior Publication Data
US 2012/0200782 A1    Aug. 9, 2012

(30) Foreign Application Priority Data

Oct. 21, 2009   (JP) .................................. 2009-242756

(51) Int. Cl.
*H04B 7/185* (2006.01)
*H01L 23/66* (2006.01)
*H01L 23/552* (2006.01)
*H01L 23/64* (2006.01)
*H01L 25/16* (2006.01)
*H04N 5/50* (2006.01)
*H05K 9/00* (2006.01)

(52) U.S. Cl.
CPC ............ *H01L 23/66* (2013.01); *H04B 7/18517* (2013.01); *H01L 23/552* (2013.01); *H01L 23/645* (2013.01); *H01L 25/16* (2013.01); *H01L 2223/6677* (2013.01); *H04N 5/50* (2013.01); *H05K 9/006* (2013.01)
USPC ........................... 455/3.02; 455/347; 455/300

(58) Field of Classification Search
None
See application file for complete search history.

(56) References Cited

U.S. PATENT DOCUMENTS 7,557,307 B2 *   7/2009   Nishizawa et al. ....... 361/816 X
2002/0158306 A1   10/2002   Niitsu
(Continued)

FOREIGN PATENT DOCUMENTS

CN   1638117   7/2005
EP   1818979   8/2007
(Continued)

OTHER PUBLICATIONS

Japanese Patent Office, Notice of reasons for refusal, issued in connection with Japanese Patent Application No. 2009-242756, dated Apr. 3, 2012. (4 pages).

(Continued)

Primary Examiner — Philip Sobutka
(74) Attorney, Agent, or Firm — K&L Gates LLP

(57) ABSTRACT

There are provided a high frequency module and a receiver capable of exhausting an electric field and a magnetic field to the outside of a shield, more closely arranging electronic components inside the shield, and being downsized. The high frequency module has integrated circuits (IC) 112, 113 each incorporating an oscillator including an inductor, and a shield case 114 as a shield for covering the ICs 112, 113, and the shield case 114 as a shield is formed with openings 116A, 116B having a size equal to or more than half the shape size of the ICs 112, 113 in areas opposed to the arrangement positions of the ICs 112, 113.

9 Claims, 15 Drawing Sheets

(56) References Cited

U.S. PATENT DOCUMENTS

| | | |
|---|---|---|
| 2008/0266830 A1 | 10/2008 | Woods |
| 2009/0308653 A1 | 12/2009 | Wu |

FOREIGN PATENT DOCUMENTS

| | | |
|---|---|---|
| JP | HEI 05-082051 | 11/1993 |
| JP | HEI 11-331015 | 11/1999 |
| JP | 2001-274720 | 10/2001 |
| JP | 2003-332928 | 11/2003 |
| JP | 2004-235738 | 8/2004 |
| JP | 2007-103610 | 4/2007 |
| JP | 2007-235650 | 9/2007 |
| JP | 2009-016715 | 1/2009 |
| WO | 2005/078796 | 8/2005 |
| WO | 2008/135908 | 11/2008 |
| WO | 2009/057018 | 5/2009 |

OTHER PUBLICATIONS

Chinese Office Action issued Aug. 7, 2013 for corresponding Chinese Appln. No. 201080046431.1

Extended European Search Report issued Jul. 12, 2013 for corresponding European Appln. No. 10824783.4.

* cited by examiner

160
CARD EDGE CONNECTOR

US 8,923,748 B2

HIGH FREQUENCY MODULE AND RECEIVER

CROSS REFERENCES TO RELATED APPLICATIONS

The present application is a national stage of International Application No. PCT/JP2010/067353 filed on Oct. 4, 2010 and claims priority to Japanese Patent Application No. 2009-242756 filed on Oct. 21, 2009, the disclosure of which is incorporated herein by reference.

BACKGROUND

The present invention relates to a high frequency module and a receiver applicable to a television tuner and the like.

In recent years, a television (TV) tuner as exemplary high frequency module has been incorporated not only in a TV receiver but also in an IT device such as personal computer (PC).

The receiver is configured as a so-called double-tuner receiver mounting a terrestrial tuner and a satellite tuner for enabling terrestrial television broadcast and satellite television broadcast to be received.

FIG. 1 is a block diagram showing an exemplary structure of a typical double-tuner broadcasting receiver applied to an IT device.

A receiver 1 in FIG. 1 has a satellite tuner 2, a terrestrial tuner 3, an input terminal 4, a splitter 5, a PCI-Express bridge 6, a power supply 7, a memory 8 and a card edge connector 9.

FIG. 1 shows an exemplary application in a PC using a computer interface called PCI-Express.

A circuit in the structure is standardized in its height to be incorporated into a predetermined slot, and the height needs to be within 3.75 mm.

In the receiver 1, a high frequency signal input from the input terminal 4 is split via the splitter 5 and then is supplied to the two tuners 2 and 3 and decoded to output data.

The data is output to a digital data PCI-Express interface via the PCI-Express bridge 6.

At this time, the power supply 7 supplies a necessary voltage and current and the memory 8 operates to hold necessary storage data.

The double-tuner receiver is required to be downsized and simplified in its mounting design. In order to address the requirements, a receiver in which two tuners are arranged in one double-tuner module is put into practical use.

FIG. 2 is a block diagram showing an exemplary structure of a broadcasting receiver to which a double-tuner module is applied.

In FIG. 2, a receiver 1A has a double-tuner module 10.

The functional parts denoted with the same numbers as FIG. 1 operate in the same way as FIG. 1.

FIG. 3 is a diagram showing a schematic structure of a double-tuner module arranged on a PCI-Express board.

There is exemplified that the double-tuner module 10 is designed on a board 11 to have a height of 2.3 mm.

In this way, a satellite tuner 12 and a terrestrial tuner 13 are mounted as integrated circuits (IC) on the board 11 and are covered with a shield case 14 so that a thin module is configured.

As described above, a more integrated IC is suitable for a semiconductor used for realizing the thin tuner, and the internal satellite tuner 12 and the internal terrestrial tuner 13 in FIG. 3 similarly each incorporate a local oscillator and its inductor for enhancing the degree of integration.

FIG. 4 is a diagram for explaining an exemplary inductor incorporated in an IC.

In a semiconductor operating in a high frequency band, a voltage controlled oscillator (VCO) typically implemented by an external circuit is an on-chip type VCO 21 laid on an IC chip 20 in FIG. 4. An inductor 22 essential for the VCO 21 is realized by an aluminum wiring in a spiral shape having a concentric shape.

The present example is an exemplary IC in which the inductor used for the local oscillator (VCO 21 in the drawing) is configured in pattern layout of the IC in the explanatory diagram of a process called QUBIC4 by NXP Semiconductors.

Typically, the inductor incorporated in the IC is arranged on a plane and thus has a spiral structure in which a concentric circle is spirally rounded as shown in FIG. 4.

Thus, an electric field and a magnetic field induced from the inductor are radiated in the vertically direction on the sheet during the IC operation.

Thus, when multiple ICs each incorporating the local oscillator circuit and the inductor are used, an effect of an electric field occurring around the ICs needs to be considered.

FIG. 5A and FIG. 5B are diagrams showing a concept of an electric field radiated by an IC incorporating an inductor therein.

FIG. 5A shows an example in which a radio wave 31 is radiated from an IC 30 mounted on the circuit board 11.

In this case, the electric field intensity is circular near the IC 30 but is parallel to the radiation surface with a distance from the IC 30 as radiation element.

FIG. 5B shows how the IC 30 is actually mounted on a tuner module.

That is, a copper foil surface 33 is covered with the shield case 14 in the lateral direction and in the top surface direction at the bottom of the IC 30 mounted on the circuit board 11. In this case, since the radiated radio wave 31 is reflected near the shield case 14 and the copper foil surface 33, the circular electric field is propagated via a path 32 while being reflected.

The shield case 14 is made of a metal typically called nickel silver as alloy of copper, nickel and zinc which is a thin material and is excellent in solderability, but any material excellent in conductivity is typically nonproblematic, and a low-cost tin material or its similar materials may be used when a limitation on shape is not severe.

FIG. 6A and FIG. 6B are diagrams showing a concept of a magnetic field radiated by the IC incorporating the inductor therein.

In FIG. 6A and FIG. 6B, the same components as those in FIG. 5 are denoted with the same numerals.

In FIG. 6A, there is formed a loop in which a magnetic field 40 is induced in the upward direction from the IC 30 and returns to the bottom surface.

Similarly, as shown in FIG. 6B, the magnetic field hit on the shield case 14 and the conductor surface of the copper foil surface 33 on the surface of the circuit board 11 generates eddy currents 41. Then, the eddy currents are propagated inside the conductor and diffused therein.

FIG. 7A and FIG. 7B are diagrams equivalently showing propagation of a high frequency signal due to the electric field and the magnetic field in FIG. 5 and FIG. 6.

In FIG. 7A, when the shield case 14 is present near the top surface of the IC 30, the electric field and the magnetic field replace the propagation of a signal due to reflection or current induction via the case with a stray capacitance 50.

FIG. 7B is an explanatory diagram in which the stray capacitance is applied to the double-tuner module in FIG. 3, and shows how the satellite tuner 12 and the terrestrial tuner 13 are connected with each other via the stray capacitance 50.

It can be easily understood that the inductor incorporated in the IC 30 is also an element for generating an electromagnetic field when a current is flowed similarly to typical components, and conversely is an element for inducing a current in the electromagnetic field.

CITATION LIST

Patent Literature

Patent Literature 1: Japanese Patent Application Laid-Open No. 2007-103610

SUMMARY

Technical Problem

A progress in IC operation frequency needs to be considered as a cause of easy radiation of a high frequency signal as described above.

As shown in FIG. 4, it is typical that an inductor suitable for a circuit operation is used in an IC incorporating a VCO, but it is typical that only a space of several-millimeter angle is given because of a limitation on the IC size.

The inductance value accomplished in this case is only about 10 nH.

For example, when parallel resonators are configured and a resonant frequency is calculated under the condition, $f=1/2\pi\sqrt{LC}$ and $C=1/(2\pi f)^2 L$ are obtained. For example, in the case of f=200 MHz, C=63 pF is required.

However, the capacitance of 63 pF to be created in the IC is so large and accordingly a chip size and cost increase in order to secure an area for opposed electrode surfaces configuring the capacitor.

On the other hand, in the semiconductor process which is faster and finer in recent years the operation frequency is on gigahertz band, and the inductor can operate at an area having several times higher than the frequency of the satellite tuner and the terrestrial tuner.

As a result of the technical progress in which the components in the semiconductor and the process operation frequency are balanced, mainly the VCO oscillating at a frequency several times higher than the reception frequency is used to divide the frequency for frequency conversion.

In the satellite tuner 12, the local frequency is around 2 to 4 GHz, and thus its wavelength is around 70 to 140 mm.

When the double tuners are to be realized in one module, an interval between the tuner ICs is easily accommodated within a size of $\lambda/4$.

A distance of $\lambda/4$ causes resonance which is efficient in receiving a radio wave, and particularly causes a situation where a radio wave is easily propagated.

FIG. 8 is a diagram showing an example in which an interference occurs between the tuners.

The example in FIG. 8 shows that the VCO oscillation of one tuner is at a local frequency.

The side bands SB1 and SB2 due to an electromagnetic field spurious generated by the other tuner are produced at both sides of the local frequency near the IF where the ½ local and the RE signal are frequency-converted. Thereby, the frequency conversion is performed at both sides of the IF.

In this way, an interference between the tuners occurs at a high frequency in gigahertz band, and thus the side bands are frequency-converted together with the originally necessary RF signal and appear in the IF band.

The frequency conversion is performed in multiple ways, for example, the interference between the VCO circuits or the electromagnetic field spurious overlapped on other circuit is frequency-converted together in a mixer unit for performing frequency conversion.

As described above, the IC having the RF circuit, including oscillator such as VCO, is covered with a thin metal casing, an electromagnetic wave is propagated to the surroundings with a smaller casing, and thus a spurious noise easily occurs in the reception band.

Patent Literature 1 describes therein an electronic device which is configured such that the shield case is deformed to efficiently cause noises occurring on the circuit board to escape, thereby reducing an effect on adjacent circuits.

The electronic device is mainly directed for drawing a metal part of the shield case and bringing it close to the IC having a frequency conversion circuit inside the tuner, and employs the shield case as a ground conductor for absorbing radio waves issued from the IC.

A slit for radiating a heat is formed in the drawing unit.

The electronic device has a function of absorbing electromagnetic waves into the shield case and not leaking them, but is difficult to prevent an interference between the tuners due to an effect of the electric field and the magnetic field.

It is an object of the present invention to provide a high frequency module and a receiver capable of exhausting an electric field and a magnetic field to the outside of a shield, more closely arranging electronic components inside the shield, and thereby being downsized.

Solution to Problem

A high frequency module according to a first aspect of the present invention has an integrated circuit incorporating an oscillator therein, and a shield for covering the integrated circuit, wherein the shield is formed with an opening having a size equal to or more than half the shape size of the integrated circuit in an area opposed to the arrangement position of the integrated circuit.

A receiver according to a second aspect of the present invention comprises an input terminal to which a satellite broadcast signal or a terrestrial broadcast signal is input, a satellite broadcast receiving circuit including a satellite tuner having a function of frequency-converting the satellite broadcast signal, a terrestrial broadcast receiving circuit including a terrestrial tuner having a function of frequency-converting the terrestrial broadcast signal, and a branching circuit for putting the satellite broadcast signal input from the input terminal into the satellite broadcast receiving circuit and putting the terrestrial broadcast signal into the terrestrial broadcast receiving circuit, wherein the satellite tuner and the terrestrial tuner are formed as a satellite tuner integrated circuit and a terrestrial tuner integrated circuit each incorporating an oscillator, respectively, and include a shield for covering at least the satellite tuner integrated circuit and the terrestrial tuner integrated circuit, and the shield is formed with an opening having a size equal to or more than half the shape size of the integrated circuit in an area opposed to the arrangement position of at least one integrated circuit among the satellite tuner integrated circuit and the terrestrial tuner integrated circuit.

Additional features and advantages are described herein, and will be apparent from the following Detailed Description and the figures.

Advantageous Effects of Invention

According to the present invention, it is possible to exhaust an electric field and a magnetic field to the outside of a shield, to more closely arrange electronic components inside the shield and thereby to downsize the module.

BRIEF DESCRIPTION OF DRAWINGS

FIG. 1 is a block diagram showing an exemplary structure of a typical double-tuner broadcasting receiver applied to an IT device or the like.

DESCRIPTION OF EMBODIMENTS

Embodiments according to the present invention will be described below with reference to the drawings.

Figure 9:
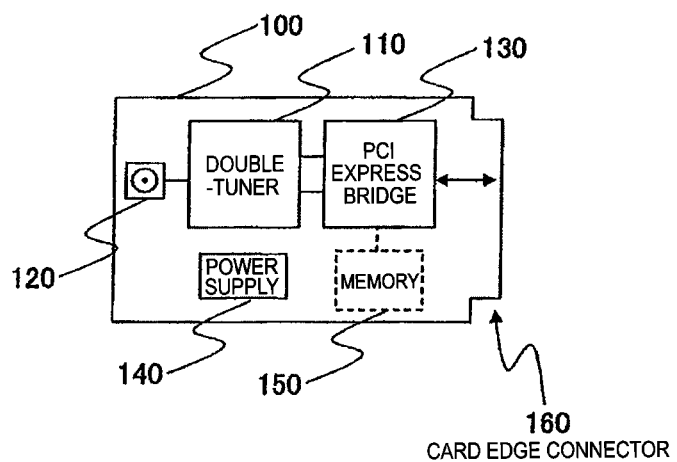
FIG. 9 is a diagram showing an exemplary structure of a broadcasting receiver employing a high frequency module according to a first embodiment of the present invention.

The explanation will be made in the following order.
1. First embodiment
2. Second embodiment 1. First Embodiment FIG. 9 is a diagram showing an exemplary structure of a broadcast signal receiver employing a high frequency module according to a first embodiment of the present invention.

Figure 10:
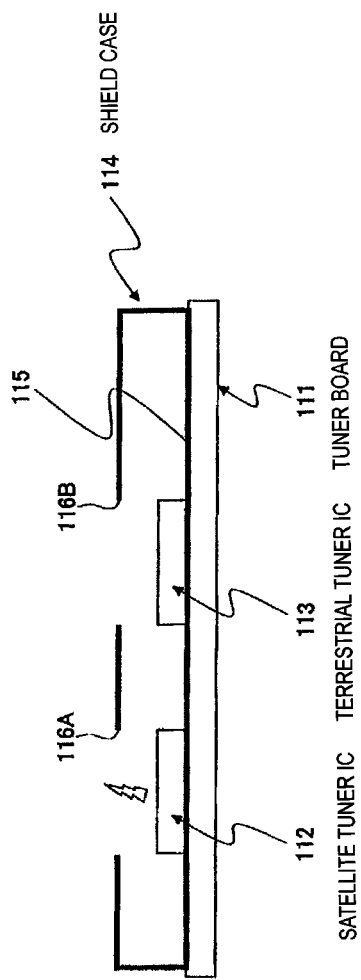
FIG. 10 is a diagram showing a schematic structure of essential parts in a double-tuner module employed as an exemplary high frequency module according to the first embodiment.

FIG. 10 is a diagram showing a schematic structure of essential parts of a double-tuner module employed as an exemplary high frequency module according to the first embodiment.

Figure 11:
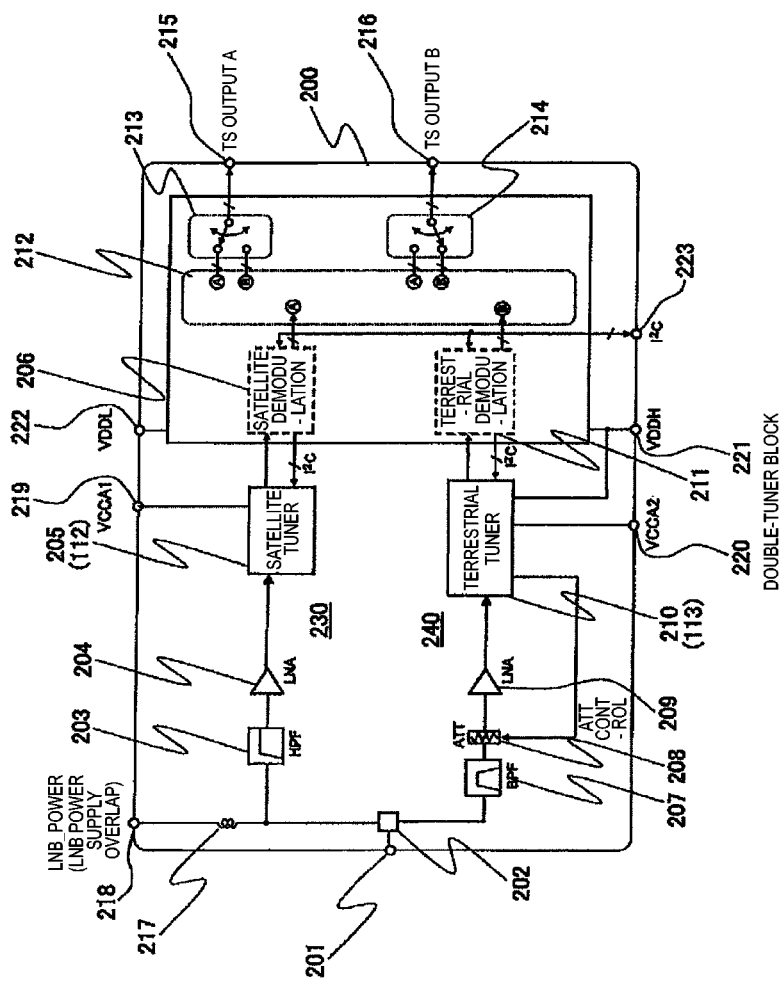
FIG. 11 is a diagram showing an exemplary specific structure of the double-tuner module employed as an exemplary high frequency module according to the present embodiment.

FIG. 11 is a diagram showing an exemplary specific structure of the double-tuner module employed as an exemplary high frequency module according to the present embodiment.

A receiver 100 has a double-tuner module 110, an input terminal 120, a PCI-Express bridge 130, a power supply 140, a memory 150, and a card edge connector 160.

The receiver 100 of FIG. 9 is an exemplary application inside a PC using a computer interface called PCI-Express.

In the present embodiment, the double-tuner module 110 as an exemplary high frequency module is configured to receive satellite TV broadcast and terrestrial TV broadcast.

[Exemplary Structure of Double-tuner Module]

There is exemplified that the double-tuner module 110 is designed to have a height of 2.3 mm on a tuner board 111 as shown in FIG. 10.

The double-tuner module 110 configured as a thin module is configured such that a satellite tuner 112 and a terrestrial tuner 113 are mounted as ICs on the tuner board 111 to be covered with a shield case 114 as a shield.

In this way, more integrated ICs are suitable also in the semiconductor used for realizing a thin tuner.

Figure 1:
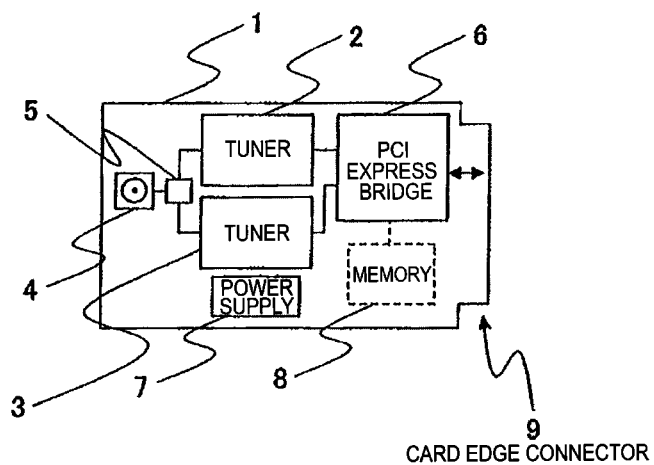
Figure 2:
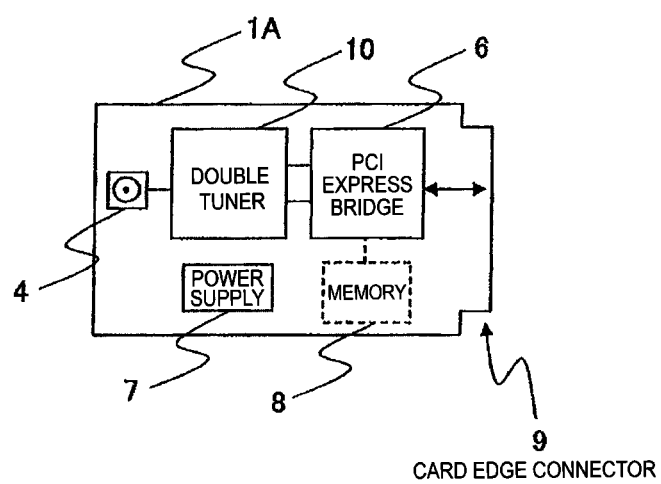
FIG. 2 is a block diagram showing an exemplary structure of a broadcasting receiver to which a double-tuner module is applied.
Figure 3:
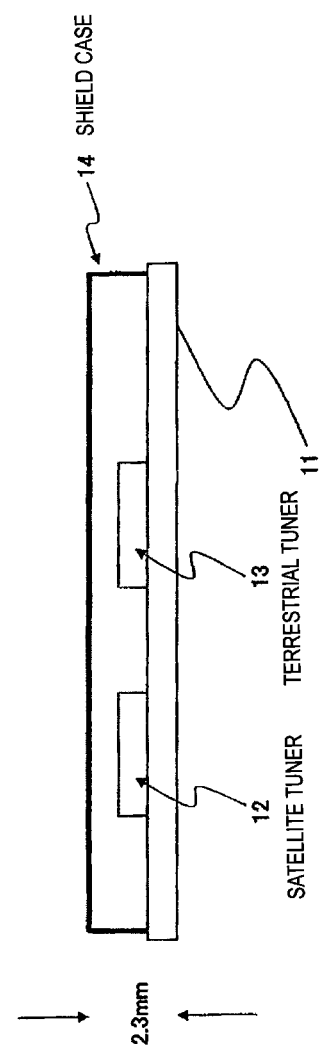
FIG. 3 is a diagram showing a schematic structure of a double-tuner module arranged on a PCI-Express board.
Figure 4:
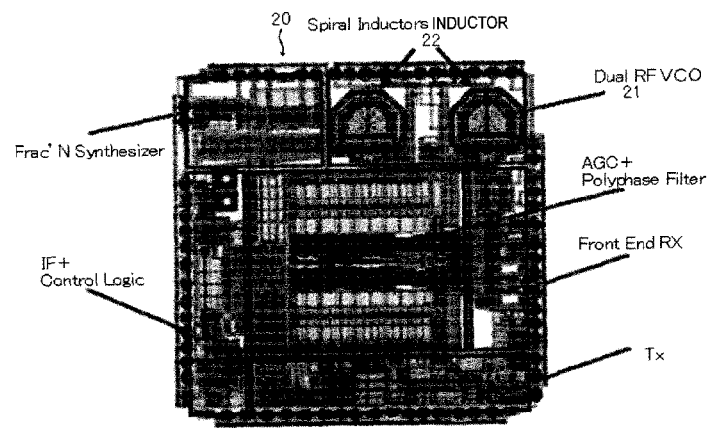
FIG. 4 is a diagram for explaining an exemplary inductor incorporated in an IC.
Figure 5A:
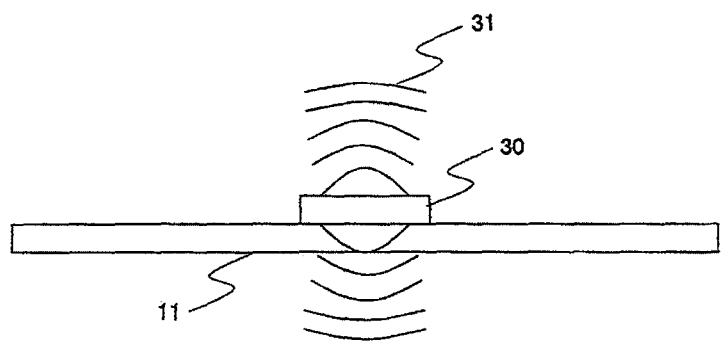
FIG. 5A is a diagram showing a concept of an electric field radiated by the IC incorporating the inductor.
Figure 5B:
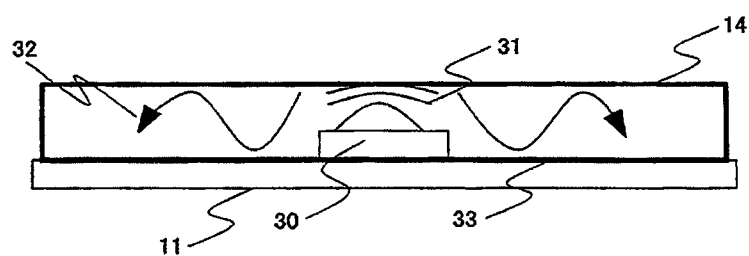
FIG. 5B is a diagram showing a concept of an electric field radiated by the IC incorporating the inductor.
Figure 6A:
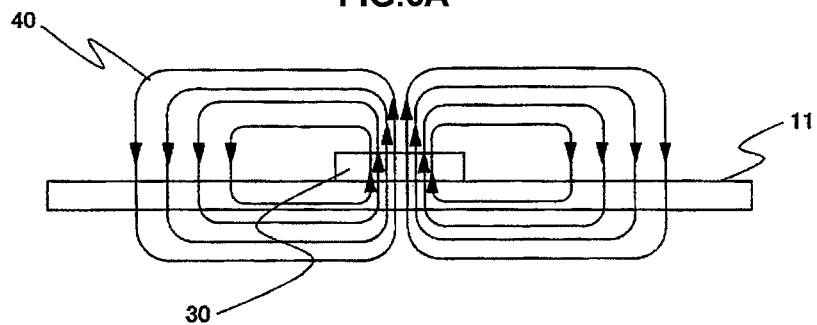
FIG. 6A is a diagram showing a concept of a magnetic field radiated by the IC incorporating the inductor.
Figure 6B:
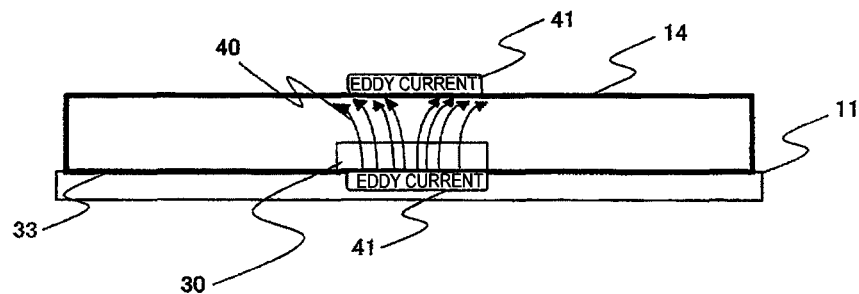
FIG. 6B is a diagram showing a concept of a magnetic field radiated by the IC incorporating the inductor.

The satellite tuner 112 and the terrestrial tuner 113 according to the present embodiment each incorporate a local oscillator and its inductor therein in order to enhance the integration as shown in FIG. 4, for example.

Numeral 115 in FIG. 10 indicates a copper foil surface as ground surface.

The double-tuner module 110 is such that openings 116A and 116B having a size equal to or more than half the IC shape size are formed on the shield case 114 positioned on the top of the satellite tuner IC 112 and the terrestrial tuner IC 113 formed of the ICs as shown in FIG. 10.

The openings 116A and 116B are formed to efficiently exhaust an electric field an a magnetic field occurring in the shield case 114 to the outside.

Figure 7A:
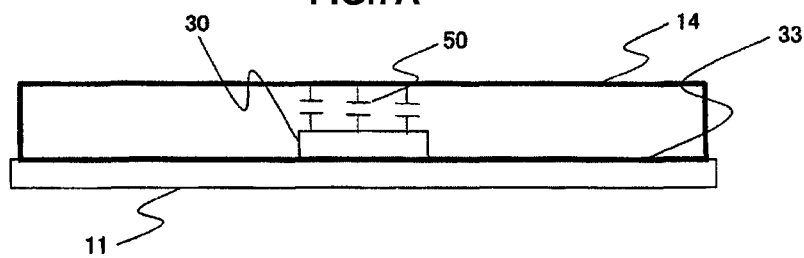
FIG. 7A is a diagram equivalently showing propagation of a high frequency signal due to the electric field and the magnetic field of FIG. 5 and FIG. 6.
Figure 7B:
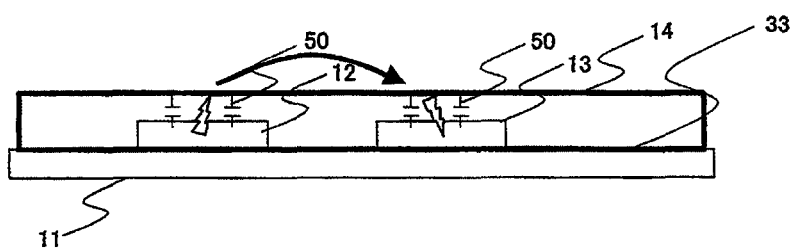
FIG. 7B is a diagram equivalently showing propagation of a high frequency signal due to the electric field and the magnetic field of FIG. 5 and FIG. 6.
Figure 8:
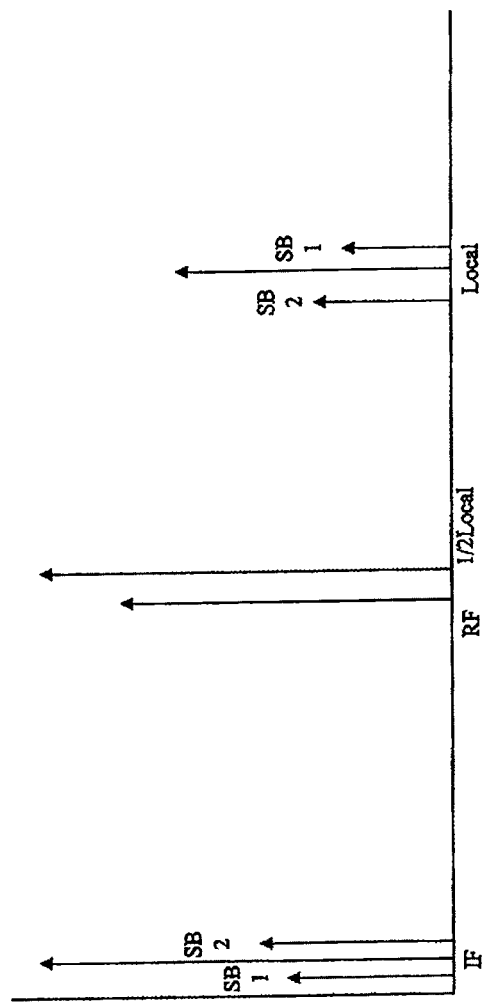
FIG. 8 is a diagram showing an example in which an interference occurs between the tuners.

As is clear from FIG. 10, the shield case 114 having the openings formed on the top of the satellite tuner IC 112 and the terrestrial tuner IC 113 is used to prevent a stray capacitance shown in FIG. 7 from occurring.

In the thus-configured double-tuner module 110, even when multiple tuner ICs are mounted which are not capable of securing a sufficient distance as compared with the wavelength of the oscillation frequency of a VCO, a mutual interference between the high frequency signals can be avoided.

The size, shape, function and the like of the openings 116 in the high frequency module (the double-tuner module in the present embodiment) will be described in detail.

The shield case 114 according to the first embodiment is made of a metal typically called silver nickel as alloy of copper, nickel and zinc which is a thin material and is excellent in solderability.

Any material excellent in conductivity is typically non-problematic for the shield ease 114, and thus a low-cost tin material or its similar materials may be used when a limitation on shape is not severe.

The inductor used as an IC-incorporated oscillator is configured to have a concentric wiring.

The inductor used as the IC-incorporated oscillator is configured to have multiple concentric wirings.

For example, a spiral inductor may be formed for a mask pattern inside the IC.

The IC may be configured such that the concentric inductor is arranged for a wiring pattern, an electronic component or a wiring.

[Description of Functions of Double-tuner Module]

A circuit configuration and functions of the double-tuner module 110 will be described in connection with FIG. 11.

Numeral 200 indicates a double-tuner module.

The double-tuner module 200 in FIG. 11 has an input terminal 201, a branching circuit 202, a high pass filter (HPF) 203, a low noise amplifier (LNA) 204, a satellite tuner 205 and a satellite demodulator 206.

The double-tuner module 200 has a band pass filter (BPF) 207, an attenuator circuit (ATT) 208, a LAN 209, a terrestrial tuner 210, and a terrestrial demodulator 211.

The double-tuner module 200 has an output matrix unit 212, switches 213, 214, and transport stream (TS) output ports 215, 216.

The double-tuner module 200 has an inductor 217 and a low noise blockdown converter (LNB) terminal 218.

The double-tuner module 200 has a satellite tuner VCCA1 terminal 219 and a terrestrial tuner VCCA2 terminal 220 as power supply terminals.

The double-tuner module 200 has a VDDH terminal 221 and a VDDL terminal 222 for satellite demodulation, terrestrial demodulation and output matrix.

The double-tuner module 200 has an I2C terminal 223.

In the double-tuner module 200, a satellite broadcast receiving circuit 230 is formed of the HPF 203, the LNA 204, the satellite tuner 205 and the satellite demodulator 20.

A terrestrial broadcast receiving circuit 240 is formed of the BPF 207, the attenuator circuit 208, the LNA 209, the terrestrial tuner 210 and the terrestrial demodulator 211.

In the double-tuner module 200, a high frequency signal applied to the input terminal 201 is divided into a satellite broadcast receiving side and a terrestrial broadcast receiving side by the branching circuit 202.

In the satellite broadcast receiving circuit 230, a satellite broadcast signal is amplified by the LNA 204 via the HPF 203 and is input into the satellite tuner 205 to be frequency-converted. Thereafter, the satellite broadcast signal is converted to TS data in the satellite demodulator 206 and is sent to the output matrix unit 212.

On the other hand, in the terrestrial broadcast receiving circuit 240, a terrestrial broadcast signal is branched in the branching circuit 202 to be limited in its band in the BPF 207, is adjusted to a proper signal level in the attenuator circuit 208, and then is amplified in the LNA 209 to be input into the terrestrial tuner 210.

The terrestrial broadcast signal is frequency-converted in the terrestrial tuner 210 and then is converted to TS data in the terrestrial demodulator 211 similar to the satellite demodulation to be sent to the output matrix unit 212.

The output matrix unit 212 has the switches 213 and 214, and can select and output TS needed for the TS output ports 215 and 216.

The inductor 217 serves to shield a DC supply and a high frequency signal to the LNB, is connected to a satellite line between the terminal 218 and the branching circuit (splitter) 202, and galvanically passes through the branching circuit 202 to supply a DC voltage from the input terminal 201 to the outside.

The terminal 223 is an input terminal of the I2C bus for controlling the satellite demodulator 206 and the terrestrial demodulator 211, and is configured to control the satellite tuner 205 and the terrestrial tuner 210 via the respective demodulators.

The entire structure of the broadcast signal receiver 100 according to the present embodiment has been described above about the double-tuner module as exemplary high frequency module.

The properties of the high frequency module having an opening according to the present embodiment will be described below.

[Description of Principle of High Frequency Module Having Opening]

Figure 12A:
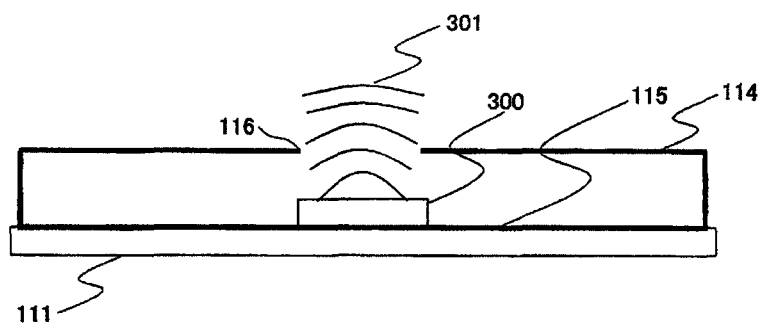
FIG. 12A is a diagram for explaining a principle of the high frequency module having an opening according to the first embodiment.
Figure 12B:
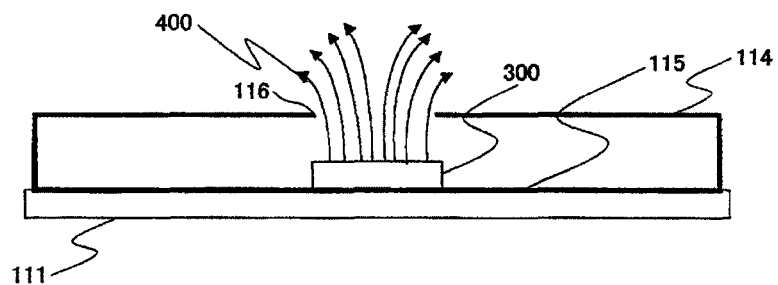
FIG. 12B is a diagram for explaining the principle of the high frequency module having the opening according to the first embodiment.

FIG. 12A and FIG. 12B are diagrams for explaining a principle of the high frequency module having an opening according to the first embodiment.

Like reference numerals are denoted to the same components as those in the double-tuner module for easy understanding.

In FIG. 12A, 300 denotes an oscillator-incorporated IC including an inductor, and 301 denotes a radio wave.

In FIG. 12B, 400 denotes a magnetic field.

FIG. 12A shows radiation of radio waves due to the high frequency module according to the present embodiment.

The opening 116 is formed at a predetermined position and a predetermined aperture such that the radio wave 301 is radiated to the outside from the opening 116 on the shield case 114 having the opening according to the present embodiment, and thus the radio wave 301 does not reflect in the shield case 114 and is not propagated in the lateral direction.

In FIG. 12B, the opening 116 is formed at the predetermined position and the predetermined aperture such that the shield case 114 having the opening 116 does not generate an eddy current for the magnetic field 400.

The magnetic field 400 is diffused to the outside of the module via the opening 116, thereby preventing the eddy current propagating through the shield case 114 from occurring.

The double-tuner module 110 using the shield case of FIG. 10 is formed based on the above principle.

As stated above, as is clear from FIG. 10, the shield case having the openings provided on the top of the satellite tuner IC 112 and the terrestrial tuner IC 113 is used to prevent a stray capacitance shown in FIG. 7 from occurring.

In the thus-configured tuner module, even when multiple tuner ICs are mounted which are not capable of securing a sufficient distance as compared with the wavelength of the oscillation frequency of the VCO, a mutual interference between the high frequency signals can be avoided.

Figure 13:
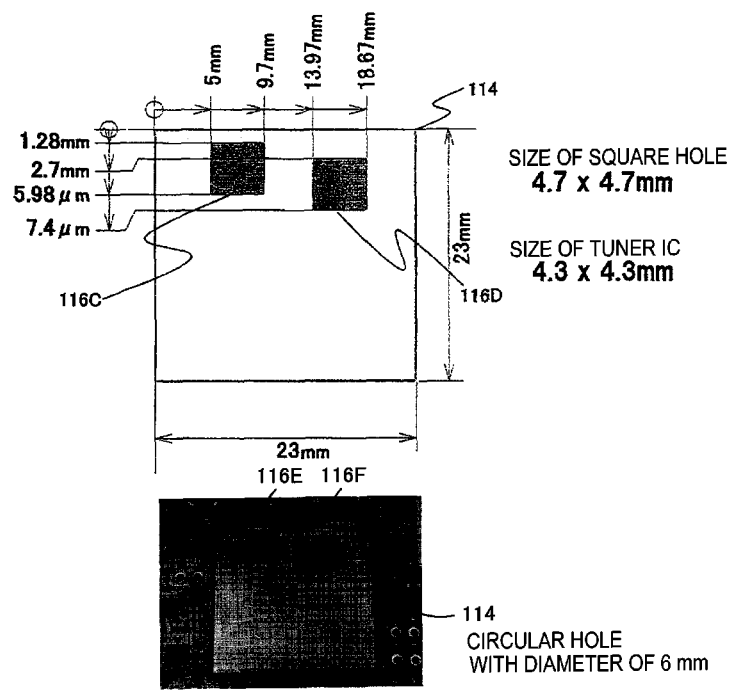
FIG. 13 is a diagram for explaining an exemplary specific structure of the opening formed on a shield case according to the present embodiment.

FIG. 13 is a diagram for explaining an exemplary specific structure of the openings formed on the shield case 114 according to the present embodiment.

The top diagram in FIG. 13 shows an example in which the square holes on top of the mounted ICs are formed as the openings 116C and 116D, where the center position is the same as that of each IC.

The aperture has a notable effect with a side equal to or more than half of each side of the IC chip, and the aperture in this case is desirable at (½)2=¼ or more and is 25% or more of the IC size.

In the present example, the square hole size is 4.7 mm×4.7 mm and the tuner IC size is 4.3 mm×4.3 mm.

The shield case 114 has a size of 23 mm×23 mm.

The bottom diagram in FIG. 13 shows that the shape of the openings 116E and 116F on the shield case 114 according to the present embodiment is circular.

Also in this case, when the aperture is 25% or more of the IC size, satisfactory effects can be expected.

In the present example, the diameter of the circular openings 116E and 116F is 6 mm.

Figure 14A:
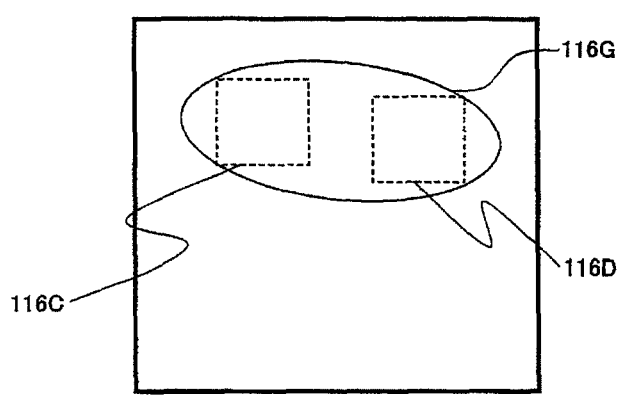
FIG. 14A is a diagram for explaining other exemplary specific structure of the opening formed on the shield case according to the present embodiment.
Figure 14B:
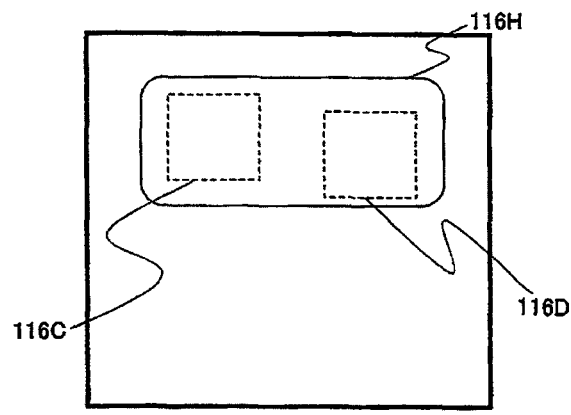
FIG. 14B is a diagram for explaining other exemplary specific structure of the opening formed on the shield case according to the present embodiment.

FIG. 14A and FIG. 14B are diagrams for explaining other exemplary specific structure of the openings formed on the shield case 114 according to the present embodiment.

In FIG. 14A, the square holes corresponding to those in the exemplary structure in the top diagram in FIG. 13 are denoted with numerals 116C and 116D, and in the present example, an opening 116G is formed as an oval hole containing both the square holes.

The stray capacitance can be avoided from occurring also in the present structure, and thus a mutual interference between the high frequency signals can be prevented.

Figure 14C:
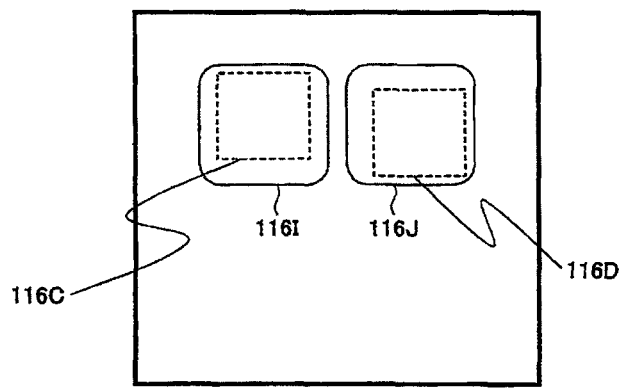
FIG. 14C is a diagram for explaining other exemplary specific structure of the opening formed on the shield case according to the present embodiment.

Similarly, in the example of FIG. 14B, an oval opening 116H contains the square holes 116C and 116D, and FIG. 14C shows an example in which multiple holes are present under the condition that the same openings 116I and 116J do not take the same centers as the IC positions.

Figure 14D:
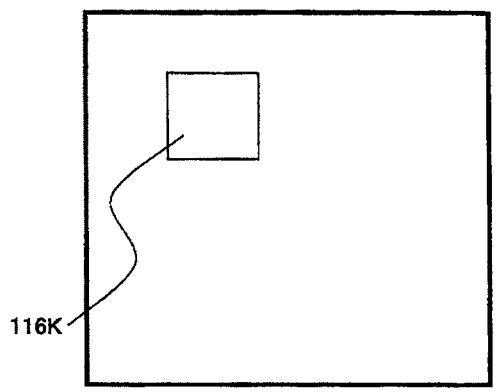
FIG. 14D is a diagram for explaining other exemplary specific structure of the opening formed on the shield case according to the present embodiment.

FIG. 14D shows a case in which only one opening 116K is present.

In the tuner module having the above structure, an actual difference in performance is expressed as a bit error rate (BER).

Figure 15:
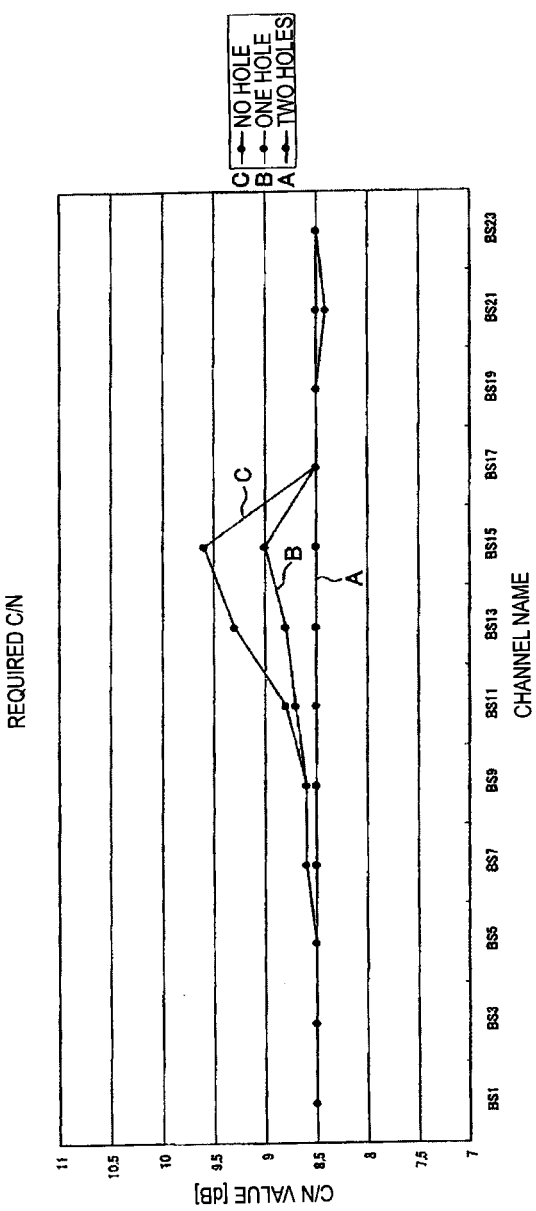
FIG. 15 is a diagram showing an example in which an interference from a terrestrial tuner to a satellite tuner is measured.

FIG. 15 is a diagram showing an example in which an interference from the terrestrial tuner to the satellite tuner is measured.

In FIG. 15, the horizontal axis indicates a channel name and the longitudinal axis indicates a CN value.

The CN ratio in the longitudinal axis indicates a standardized Carrier/Noise ratio of an input signal necessary for so excellent a state of the BER called required CN.

In FIG. 15, the property indicated by A is when two openings are formed, the property indicated by B is when one opening is formed, and the property indicated by C is when no opening is formed.

Particularly, the effects of the holes near the BS15 channel used for the satellite broadcast in Japan are indicated.

When two openings are formed, an interference can be sufficiently prevented.

Also when only one opening is formed, a sufficient interference preventing effect is indicated as compared with the case with no hole.

That is, the effect of the required CN in FIG. 15 is for the local frequency of 2636 MHz which is twice the input frequency of 1318 MHz near the BS-15 channel, and it is most effective that as many holes as the ICs to be mounted are provided.

It is clear that only one hole achieves the effect.

2. Second Embodiment

Figure 16:
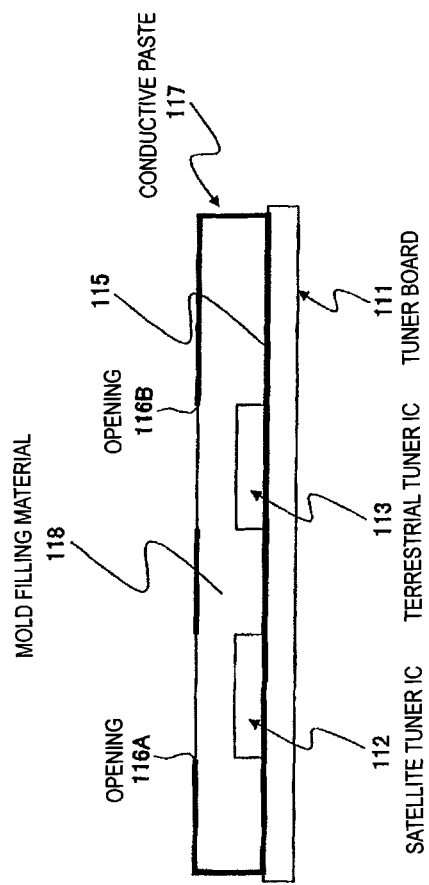
FIG. 16 is a diagram showing an exemplary structure of a double-tuner module in a broadcast signal receiver according to a second embodiment of the present invention.

FIG. 16 is a diagram showing an exemplary structure of a double-tuner module in a broadcast signal receiver according to a second embodiment of the present invention.

A double-tuner module 110A according to the second embodiment is different from the double-tuner module 110 according to the first embodiment in that a conductive paste 117 is applied to form a conductive application film as a shield instead of the shield case.

That is, in the double-tuner module 110A, a mold filling material 118 is sealed around the satellite tuner IC 112 and the terrestrial tuner IC 113 mounted on the tuner board 111 for protection.

The double-tuner module 110A is applied with the conductive paste 117 at its outer periphery for sealing thereby to have the same effects as those of the shield case.

At this time, the opening 116A and the opening 116B are formed on the application film 117A of the conductive paste 117 having the same operation as the shield case, thereby to exhaust the radio waves and the magnetic field line to the outside of the shield body made of the conductive paste.

The detailed operation principle is exactly the same as that of the shield case, and thus an explanation thereof will be omitted.

The ground surface 115 on the board 111 is electrically connected to the conductive paste 117 at its walls thereby to form the shield body.

As described above, the following effects can be obtained according to the present embodiment. The electric filed and the magnetic field can be exhausted to the outside of the shield, the electronic components inside the shield can be more closely arranged, and thereby the module can be downsized.

For example, the present embodiment is effective when the satellite tuner IC or the terrestrial tuner IC using the shield case incorporates an oscillator such as VCO using a spiral inductance.

That is, the present embodiment is effective when the electric field and the magnetic field radiated by the oscillation circuit electromagnetically combine or magnetically combine the surrounding circuits thereby to generate a spurious noise, or the ICs are mounted so closely that a deterioration in the phase noise of the oscillator cannot be ignored.

Particularly, since a group of more strongly occurring noises can be radiated to the outside of the shield due to the shield case, thereby arranging the components so closely.

Particularly when multiple tuners are configured on the same board, the same effect can be obtained as when the electric field and the magnetic field are exhausted to the outside of the shield, and the effect is conspicuous particularly when the tuners are simultaneously operated.

The present embodiment is effective also when an independent oscillator having a transmission and reception function like a transceiver is used.

Further, since only one oscillator can cause a noise in another path to the mixer circuit or the input circuit, the shield having the openings is provided and thus the effect can be expected.

Additionally, the present embodiment is effective also for a transmitter/receiver having multiple bands such as 2.4 GHz band and 5 GHz band like a wireless LAN.

The semiconductor to which the present structure is applied includes monolithic IC incorporating a spiral inductance in the IC mask pattern.

The semiconductor includes an IC having an inductance formed on a small board on which a silicon bare chip called SIP (System In Package) is mounted.

Alternatively, the semiconductor includes an IC using a spiral inductance as a typical external device.

The present embodiment is effective also for any IC, and can be applied thereto.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

100 Broadcast signal receiver
110 Double-tuner module
111 Tuner board
112 Satellite tuner IC
113 Terrestrial tuner IC
114 Shield case
116, 116A to 116K Opening
117 Conductive paste
120 Input terminal
130 PCI-Express bridge
140 Power supply
150 Memory
160 Card edge connector

The invention claimed is:

1. A receiver comprising:
an input terminal to which a satellite broadcast signal or a terrestrial broadcast signal is input;
a satellite broadcast receiving circuit including a satellite tuner having a function of frequency-converting the satellite broadcast signal;
a terrestrial broadcast receiving circuit including a terrestrial tuner having a function of frequency-converting the terrestrial broadcast signal; and
a branching circuit for putting the satellite broadcast signal input from the input terminal into the satellite broadcast receiving circuit and putting the terrestrial broadcast signal into the terrestrial broadcast receiving circuit,
wherein the satellite tuner and the terrestrial tuner are formed as a satellite tuner integrated circuit and a terrestrial tuner integrated circuit each incorporating an oscillator, respectively, and
include a shield for covering at least the satellite tuner integrated circuit and the terrestrial tuner integrated circuit, and
the shield is formed with an opening having a size equal to or more than half the shape size of the integrated circuit in an area opposed to the arrangement position of at least one integrated circuit among the satellite tuner integrated circuit and the terrestrial tuner integrated circuit.

2. The receiver according to claim 1,
wherein the shield is formed with openings having a size equal to or more than half the shape size of each integrated circuit in the respective areas opposed to the arrangement positions of the satellite tuner integrated circuit and the terrestrial tuner integrated circuit.

3. The receiver according to claim 1,
wherein the shield is formed with an oval opening containing the openings having a size equal to or more than half the shape size of each integrated circuit over the areas opposed to the arrangement positions of the satellite tuner integrated circuit and the terrestrial tuner integrated circuit.

4. The receiver according to claim 1,
wherein the shield is formed of a metallic shield case.

5. The receiver according to claim 1,
wherein the shield is made of a conductive application film.

6. A high frequency module comprising:
a plurality of integrated circuits including an integrated circuit incorporating an oscillator; and
a shield for covering the integrated circuit incorporating the oscillator,
wherein the shield is formed with an opening having a size equal to or more than half the shape size of the integrated circuit incorporating the oscillator in an area opposed to the arrangement position of the integrated circuit incorporating the oscillator,
wherein the shield is formed with an opening having a size equal to or more than half the shape size of the integrated circuit incorporating the oscillator in an area opposed to the arrangement position of at least one of the integrated circuits, and
wherein the integrated circuits each comprise:
a satellite tuner integrated circuit for processing a satellite broadcast signal; and
a terrestrial tuner integrated circuit for processing a terrestrial broadcast signal.

7. The high frequency module according claim 6,
wherein the shield is formed of a metallic shield case.

8. The high frequency module according to claim 6,
wherein the shield is made of a conductive application film.

9. A high frequency module comprising:
a plurality of integrated circuits including an integrated circuit incorporating an oscillator; and
a shield for covering the integrated circuit incorporating the oscillator,
wherein the shield is formed with an opening having a size equal to or more than half the shape size of the integrated circuit incorporating the oscillator in an area opposed to the arrangement position of the integrated circuit incorporating the oscillator, and
wherein the integrated circuits each comprise:
a satellite tuner integrated circuit for processing a satellite broadcast signal; and
a terrestrial tuner integrated circuit for processing a terrestrial broadcast signal.

* * * * *